United States Patent

Kishimura

[11] Patent Number: 5,905,016
[45] Date of Patent: May 18, 1999

[54] RESIST PATTERN FORMING METHOD AND RESIST MATERIAL

[75] Inventor: Shinji Kishimura, Tokyo, Japan

[73] Assignee: Mitsubishi Denki Kabushiki Kaisha, Tokyo, Japan

[21] Appl. No.: 08/917,604

[22] Filed: Aug. 26, 1997

[30] Foreign Application Priority Data

Mar. 5, 1997 [JP] Japan ................................ 9-050314

[51] Int. Cl.⁶ .................................................. G03C 1/492
[52] U.S. Cl. ....................... 430/270.1; 430/326; 430/328; 430/330
[58] Field of Search ..................... 430/328, 326, 430/330, 270.1

[56] References Cited

U.S. PATENT DOCUMENTS

| | | | |
|---|---|---|---|
| 5,262,281 | 11/1993 | Bauer et al. | 430/323 |
| 5,279,923 | 1/1994 | Hiro et al. | 430/270 |
| 5,346,803 | 9/1994 | Crivello et al. | 430/270 |
| 5,516,626 | 5/1996 | Ohmi et al. | 430/328 |
| 5,556,734 | 9/1996 | Yamachika et al. | 430/270.1 |

FOREIGN PATENT DOCUMENTS

| | | |
|---|---|---|
| 5-2274 | 1/1993 | Japan . |
| 5-323610 | 12/1993 | Japan . |
| 6-214402 | 8/1994 | Japan . |
| 7-201722 | 8/1995 | Japan . |
| 7-230169 | 8/1995 | Japan . |
| 8-22125 | 1/1996 | Japan . |

*Primary Examiner*—John A. McPherson
*Assistant Examiner*—Rosemary Ashton
*Attorney, Agent, or Firm*—Oblon, Spivak, McClelland, Maier & Neustadt P.C.

[57] ABSTRACT

A polymer having a unit expressed as "—$CH_2CHR$—" as well as a substituent capable of being decomposed by acid is employed as a base resin for a resist material. The resist material is further mixed with an acid generator. A resist pattern obtained by selectively exposing and developing the resist material is irradiated with light having a wavelength of not more than 300 nm under a nitrogen atmosphere. Active hydrogen at the $\alpha$-position of the unit dissociates as a result to form polymer radicals, which are linked with each other in progress of a crosslinking reaction. Namely, a crosslinked structure of the polymer is formed. Consequently, a resist pattern having high dry etching resistance is completed.

20 Claims, 7 Drawing Sheets

RESIN 1

TEST RESULTS

| No. | METHOD | TYPE OF RESIN | ETCHING RATE (Å/min) | RESIST FILM THICKNESS RATIO |
|---|---|---|---|---|
| 1 | EMBODIMENT 1 | RESIN 1 | 2300 | 0.75 |
| 2 | | RESIN 2 | 2000 | 0.73 |
| 3 | | RESIN 3 | 2500 | 0.72 |
| 4 | | RESIN 4 | 1500 | 0.69 |
| 5 | EMBODIMENT 2 | RESIN 5 | 1800 | 0.93 |
| 6 | | RESIN 6 | 1200 | 0.96 |
| 7 | EMBODIMENT 3 | RESIN 4 | 1500 | 0.95 |
| 8 | EMBODIMENT 4 | RESIN 1 | 1800 | 0.67 |
| 9 | EMBODIMENT 5 | RESIN 1 | 2000 | 0.73 |
| 10 | PRIOR ART | RESIN A | 1500 | — |
| 11 | | RESIN B | 1700 | — |
| 12 | | RESIN C | 3500 | — |
| 13 | | RESIN D | 2500 | — |
| 14 | EMBODIMENT 1 | RESIN C | UNMEASURABLE | UNMEASURABLE |
| 15 | | RESIN D | UNMEASURABLE | UNMEASURABLE |

RESIST PATTERN FORMING METHOD AND RESIST MATERIAL

BACKGROUND OF THE INVENTION

1. Field of the Invention

The present invention relates to a resist pattern forming method and a resist material suitable for this method, and more particularly, it relates to betterment for improving dry etching resistance of a resist material.

2. Description of the Background Art

In recent years, a semiconductor device is increasingly refined followed by a shorter wavelength of light for irradiation employed for photolithography. A resist material employed for photolithography must be transparent with respect to light of a wavelength in an application range therefore. As base resins serving as the main components of resist materials satisfying such requirement, novolak resin (resin A described later) suitable to g to i rays (436 nm to 365 nm in wavelength) of a mercury lamp and polyhydroxystyrene (resin B described later) suitable to a KrF excimer laser beam (248 nm in wavelength) are widely known as typical resins at present.

On the other hand, acrylic resins C and D containing no benzene rings, illustrated in FIGS. 17 and 18, are now watched with interest as base resins for resist materials employed for an ArF excimer laser beam (193 nm in wavelength) which is regarded as advanced light for irradiation. A material such as novolak resin containing a benzene ring is unsuitable to an ArF excimer laser beam in view of transparency, despite an advantage of excellent dry etching resistance.

In each of the resins C and D shown in FIGS. 17 and 18, units U1, U2 and U3 form methacrylic units respectively. A resist material composed of a base resin prepared from the resin C or D having such methacrylic units contains an acid generator such as triphenylsulfonium triflate as a mixture which is added to the base resin.

When the resist material is irradiated with light, hydrogen (generally acid) is generated due to the action of the added acid generator, to act under heating on that substituent D1 in the resin C or D which is capable of being decomposed by the acid. Consequently, this substituent D1 is cut off from a principal chain of the polymer. Thus, the polymer is denatured by irradiation with light.

When a developer is applied to the resist material after the heating, parts of the polymer denatured by the light are readily dissolved while the remaining parts are not dissolved but remain. In other words, the parts of the resist material irradiated with the light are selectively removed. Consequently, patterning of the resist material is implemented. Namely, the resin C or D forms a positive chemical amplification resist material.

However, the resins C and D containing no benzene rings which are expected for application to an advanced resist material are inferior in dry etching resistance to a resin such as novolak resin which is widely employed at present. This bottlenecks reduction of the wavelength of the light for irradiation.

On the other hand, the resist aspect ratio (resist film thickness/resist pattern size) is increased as a result of improvement in resolution following reduction of the wavelength of the light for irradiation. In order to prevent the resist pattern from falling in the so-called resist pattern fall after development and rinsing, it is necessary to suppress the thickness of the resist material which is deposited on a target of etching (i.e., an underlayer) such as a surface of a semiconductor device.

Further, the etching rate depends on the resist aspect ratio, and known is the so-called RIE-lag such that the etching rate is retarded as the width of the resist pattern is narrowed, i.e., the aspect ratio is increased. In order to suppress such reduction of the etching rate caused by the RIE-lag phenomenon for preventing insufficient etching, it is as well necessary to suppress the thickness of the resist material.

As the thickness of the deposited resist material is suppressed, higher dry etching resistance is required to the resist material. In order to reduce the wavelength of the light for irradiation, therefore, the dry etching resistance, i.e., the selection ratio of the resist material to the underlayer in etching must be improved beyond that in the conventional resist material.

SUMMARY OF THE INVENTION

According to a first aspect of the present invention, a resist pattern forming method of forming a resist pattern on a surface of a target includes a step of preparing the target, a material preparing step of preparing a positive chemical amplification resist material, an application step of applying the resist material onto the surface of the target, a patterning step of patterning the resist material through selective irradiation with radiation, heating, and removal of an irradiated part by development, and an irradiation step of irradiating the patterned resist material with light having a wavelength of not more than 300 nm in an atmosphere of nonreactive gas, and the resist material contains a polymer and an acid generator, the polymer has a unit which is expressed as "—$CH_2CHR$—" as well as a substituent which is capable of being decomposed by acid, where "R" is at least one selected from a group consisting of hydrogen, an alkyl group, a carboxyl group, carboxylic acid ester, acetal, an alicyclic group, a group having an aromatic ring, and a group having a heterocycle, the acid generator is a substance generating acid through the irradiation with the radiation, and the non-reactive gas is non-reactive with the polymer under the light.

According to a second aspect of the present invention, a resist pattern forming method of forming a resist pattern on a surface of a target includes a step of preparing the target, a material preparing step of preparing a positive chemical amplification resist material, an application step of applying the resist material onto the surface of the target, a patterning step of patterning the resist material through selective irradiation with radiation, heating, and removal of an irradiated part by development, and an irradiation step of irradiating the patterned resist material with light having a wavelength of not more than 300 nm in an atmosphere of a gas, the resist material contains a polymer and an acid generator, the polymer has a unit which is expressed as "—$CH_2CHR$—" as well as a substituent which is capable of being decomposed by acid, where "R" is at least one selected from a group consisting of hydrogen, an alkyl group, a carboxyl group, carboxylic acid ester, acetal, an alicyclic group, a group having an aromatic ring, and a group having a heterocycle, the acid generator is a substance generating acid through the irradiation with the radiation, and the gas is a gas of the same type as that generated in decomposition of the substituent of the polymer induced by acid.

According to a third aspect of the present invention, the atmosphere is pressurized up to a pressure exceeding the ordinary pressure.

According to a fourth aspect of the present invention, the pattern forming method further includes a heating step of heating the patterned resist material during, after, or during and after the irradiation step.

According to a fifth aspect of the present invention, the heating step is executed after the irradiation step.

According to a sixth aspect of the present invention, the resist material is heated within a temperature range below a heat decomposition temperature of the substituent in the heating step.

According to a seventh aspect of the present invention, a composition ratio of the unit is at least 50%.

According to an eighth aspect of the present invention, a composition ratio of the unit is at least 70%.

According to a ninth aspect of the present invention, a resist material contains a polymer and an acid generator, and the polymer has a unit which is expressed as "—$CH_2CHR$—" as well as a substituent which is capable of being decomposed by acid, where "R" is at least one selected from a group consisting of hydrogen, an alkyl group, a carboxyl group, carboxylic acid ester, acetal, an alicyclic group, a group having an aromatic ring and a group having a heterocycle, and the acid generator is a substance generating acid by irradiation with radiation.

In the method according to the first aspect of the present invention, the positive chemical amplification resist material is patterned and thereafter irradiated with the light having the wavelength of not more than 300 nm in the atmosphere of the non-reactive gas. Therefore, active hydrogen at the α-position of the unit dissociates to form polymer radicals, which are linked with each other by a crosslinking reaction. Namely, a crosslinked structure of the polymer is formed. Consequently, a resist pattern (patterned resist material) having high dry etching resistance is completed.

Namely, the dry etching resistance of the resist pattern can be improved by employing this method. In particular, the resist material is irradiated with the light in the atmosphere of the non-reactive gas, whereby cutting of principal chains of the polymer caused by oxygen or a crosslinking reaction through oxygen is suppressed. Thus, the dry etching resistance can be effectively improved.

In the method according to the second aspect of the present invention, the resist material is irradiated with the light under the atmosphere of the gas of the same type as that generated in acid induced decomposition of the substituent. Thus, the resist pattern is inhibited from shrinkage caused by discharge of the gas to the exterior of the resist pattern. Namely, the resist pattern is inhibited from deformation.

In the method according to the third aspect of the present invention, the atmosphere of the gas is pressurized beyond the ordinary pressure, whereby gas discharge is further suppressed, to further inhibit the resist pattern from shrinkage as a result.

In the method according to the fourth aspect of the present invention, the resist material is heated, whereby a crosslinking reaction is facilitated and the dry etching resistance is further improved as a result.

In the method according to the fifth aspect of the present invention, the resist material is heated after the irradiation with the light, and hence a crosslinked structure is considerably completed when the resist material is heated. Thus, the resist pattern is inhibited from shrinkage.

In the method according to the sixth aspect of the present invention, the resist material is heated within the temperature range below the thermal decomposition temperature of the substituent, whereby a crosslinking reaction can be facilitated while relatively suppressing decomposition of the substituent. Namely, the dry etching resistance can be further improved while inhibiting the resist pattern from shrinkage.

In the method according to the seventh aspect of the present invention, the composition ratio of the unit having hydrogen at the α-position is at least 50%, leading to effective progress of a crosslinking reaction. Thus, the dry etching resistance is further improved.

In the method according to the eighth aspect of the present invention, the composition ratio of the unit having hydrogen at the α-position is at least 70%, leading to further effective progress of a crosslinking reaction. Thus, the dry etching resistance is still further improved.

The resist material according to the ninth aspect of the present invention can implement high dry etching resistance by application to the method according to the present invention.

Throughout the specification, the term "light" or "light for irradiation" indicates a concept including not only visible light but ultraviolet light.

An object of the present invention is to provide a resist pattern forming method which can improve dry etching resistance of a resist material, and a resist material suitable for this method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

1. Embodiment 1

First, a resist pattern forming method according to an embodiment 1 of the present invention is described.

<1—1. Example Employing Resin 1

In the method according to this embodiment, a polymer having a unit expressed in a chemical formula "—$CH_2CHR$—" as well as a substituent capable of being decomposed by acid is employed as a base resin for a resist material. As understood from the chemical formula, a hydrogen atom is present at the α-position of this unit. "R" contained in this unit is hydrogen, an alkyl group, a carboxyl group, carboxylic acid ester, acetal, an alicyclic group, a group having an aromatic ring, or a group having a heterocycle.

Figure 2:
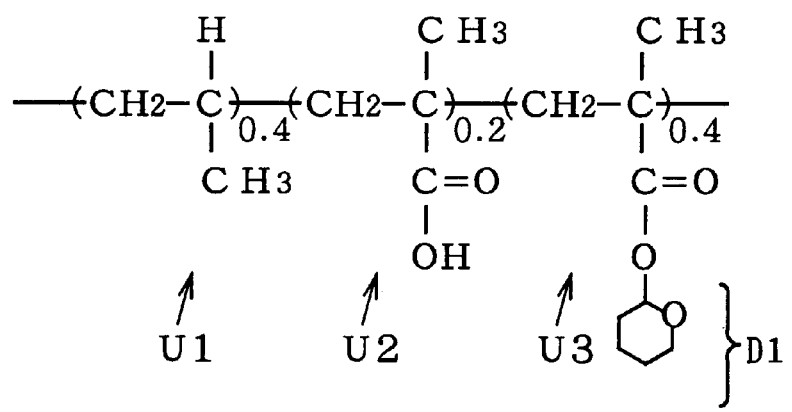
FIG. 2 illustrates the structural formula of a resin 1.

FIG. 2 illustrates the structural formula of an exemplary base resin 1 employed in this embodiment. The resin 1 illustrated in FIG. 2 is a polymer having units U1, U2 and U3 which are in composition ratios of 0.4:0.2:0.4. The unit U1 corresponds to the aforementioned unit expressed as "—$CH_2CHR$—". Namely, a hydrogen atom is present at the α-position of the unit U1.

The unit U3 has a substituent D1 which is capable of being decomposed by acid. Further, the unit U2 has a carboxyl group, and the unit U3 has carboxylic acid ester. Namely, the units U2 and U3 form methacrylic units, similarly to the units contained in the resins C and D.

An acid generator is added to the employed resist material as a mixture, in addition to the base resin such as the resin 1, i.e., the main component, not only in this embodiment. In other words, the employed resin material is a positive chemical amplification material in any embodiment similarly to the resist material containing the resin C or D as a base resin.

The acid generator is preferably prepared from triphenylsulfonium triflate, diphenyliodonium triflate, β-oxocyclohexylmethyl(2-norbornyl)sulfonium triflate, or N-hydroxysuccinimide tosylate, for example. β-oxocyclohexylmethyl(2-norbornyl)sulfonium triflate or N-hydroxysuccinimide tosylate is particularly suitable to an ArF excimer laser beam.

Figure 3:
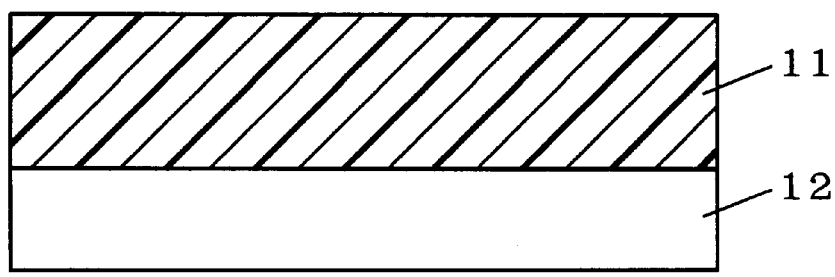
FIG. 3 is a step diagram showing the method according to the embodiment 1 of the present invention.

FIGS. 1 and 3 to 5 are step diagrams showing the resist pattern forming method according to this embodiment. According to this method, a resist material 11 is first applied onto a semiconductor substrate (target) 12, which is an exemplary subject of etching, as shown in FIG. 3. A positive chemical amplification resist material containing the resin 1 or the like as a base resin is prepared as the resist material 11, in advance of the step shown in FIG. 3.

Figure 4:
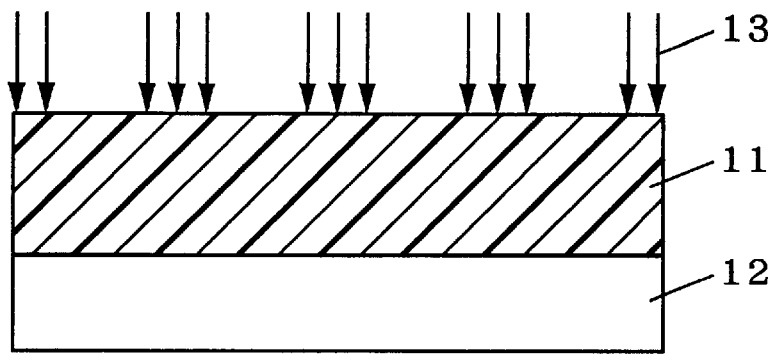
FIG. 4 is a step diagram showing the method according to the embodiment 1 of the present invention.

Then, the resist material 11 is irradiated with light (radiation) 13 such as an ArF excimer laser beam, for example, through a mask pattern to be transferred, as shown in FIG. 4. In other words, the resist material 11 is exposed in a prescribed pattern. Thereafter the resist material 11 is heated.

Figure 5:
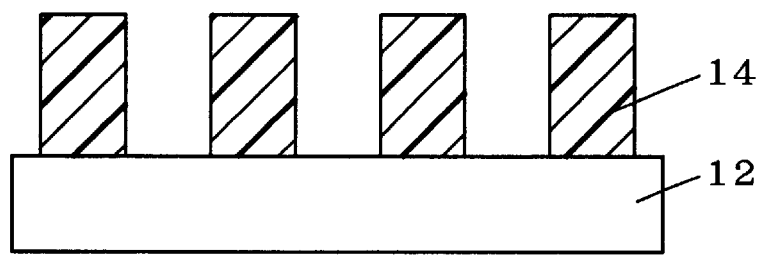
FIG. 5 is a step diagram showing the method according to the embodiment 1 of the present invention.

Then, the exposed resist material 11 is developed, as shown in FIG. 5. In this developing step, the resist material 11 is rinsed after application of a developer. Consequently, exposed parts of the resist material 11 are selectively removed, whereby the patterned resist material 11, i.e., a resist pattern 14 is formed on the semiconductor substrate 12. Since the resist material 11 is of a positive type, the resist pattern 14 corresponds to parts of the resist material 11 not irradiated with the light 13 through the mask pattern.

Figure 1:
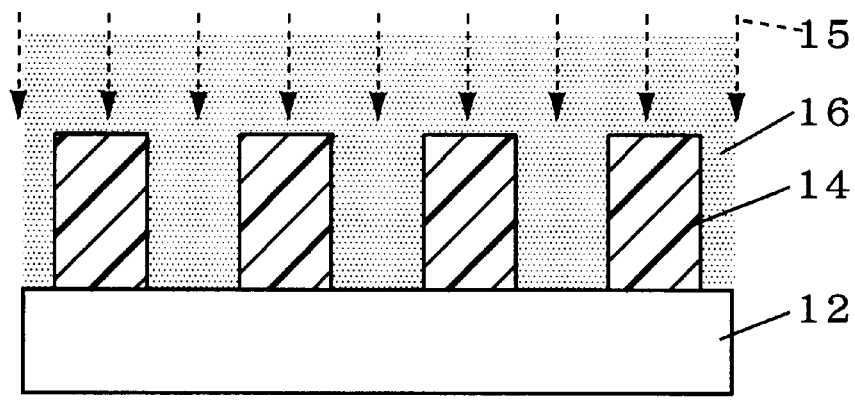
FIG. 1 is a step diagram showing a method according to an embodiment 1 of the present invention.

Then, the overall surface of the resist pattern 14 is irradiated with light 15 having a wavelength of not more than 300 nm under a nitrogen atmosphere (non-reactive gate atmosphere) 16, as shown in FIG. 1. The light 15 is applied with strength of 200 mW/cm$^2$, for example, over one minute. This dose is set by far higher than that of the light 13 in the patterning step shown in FIG. 4. Through this step, the resist pattern 14 is effectively improved in dry etching resistance, as shown by a result of a verification test described later.

Thereafter the resist pattern 14 is employed as a screen, for selectively etching the surface part of the semiconductor substrate 12. The surface part is etched by a well-known method employing an ECR etcher with fluorocarbon gas serving as an etchant, for example.

Figure 6:
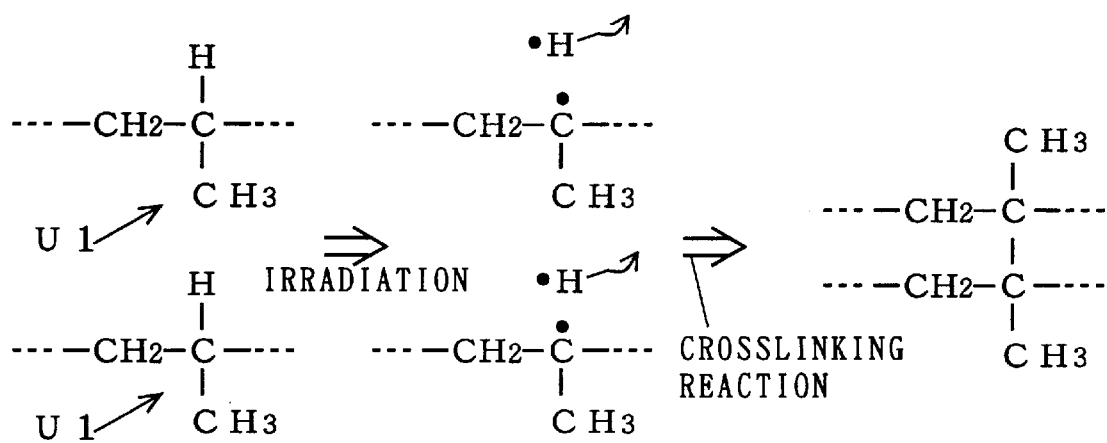
FIG. 6 is an explanatory diagram for illustrating the mechanism of a crosslinking reaction.

FIG. 6 is an explanatory diagram for illustrating the mechanism improving the dry etching resistance of the resist pattern 14. Hydrogen located at the α-position of the unit U1 is so active that the same readily dissociates due to stimulation by light or the like. Therefore, this active hydrogen dissociates upon irradiation with the light 15. Consequently, polymer parts converted to radicals due to loss of hydrogen, i.e., polymer radicals are linked with each other, thereby forming a crosslinked structure of the polymer.

Namely, the light 15 causes a crosslinking reaction, whereby the polymer radicals are two- or three-dimensionally linked with each other. In the crosslinked structure formed by such linkage of the polymer radicals, high resistance against action of the etchant is expected.

Chemical amplification brought by hydrogen (generally acid) generated by an acid generator has by far higher sensitivity to light as compared with the crosslinking reaction of polymer radicals resulting from dissociation of active hydrogen. For example, a dose of not more than several 10 mJ/cm$^2$ is sufficient for causing the chemical amplification with a KrF excimer laser beam. In order to cause a crosslinking reaction, on the other hand, a dose of at least several 100 mJ/cm$^2$ is necessary with reference to light having a wavelength of not more than 300 nm.

Through the irradiation with the light 13 (FIG. 4) performed in the patterning step, therefore, substantially no crosslinking reaction takes place despite progress of the chemical amplification causing dissociation of the substituent D1. Thus, the presence of active hydrogen in the unit U1 causes no hindrance on formation of the resist pattern 14 through the patterning step shown in FIGS. 4 and 5.

In the step shown in FIG. 1, i.e., the irradiation with the light 15 performed after the patterning, on the other hand, a crosslinking reaction is caused while chemical amplification progresses at the same time. Due to progress of the crosslinking reaction along with the chemical amplification, however, the polymer radicals are two- or three-dimensionally linked with each other to complete the crosslinked structure, whereby the dry etching resistance is improved.

The step shown in FIG. 1 is carried out in the nitrogen atmosphere 16, for the following reason: If the resist pattern 14 is irradiated with the light 15 in an atmosphere containing oxygen, the oxygen forms radicals due to the action of the light 15. The radical oxygen cuts the principal chain of the polymer, disadvantageously leading to reduction of the dry etching resistance.

Even if the principal chain is not cut, the polymer radicals are linked with each other through oxygen in a crosslinking reaction, to complete a crosslinked structure containing oxygen as a result. It is known that the dry etching resistance of a polymer is increased as the number of carbon-to-carbon bonds is increased and that of oxygen atoms is reduced. This is reported by H. Gokan, S. Esho and Y. Ohnishi, J. Electrochem. Soc., Vol. 130, p. 143 (1983), for example. When a crosslinked structure containing oxygen is completed, therefore, the dry etching resistance is reduced.

If a step similar to that shown in FIG. 1 is executed in an atmosphere containing oxygen, the effect of improving dry etching resistance is thus reduced by a double mechanism. However, it is possible to suppress such hindrance by oxygen and improve the dry etching resistance by executing irradiation with the light 15 in the nitrogen atmosphere 16. A similar effect can be attained by executing the step shown in FIG. 1 in an atmosphere of inert gas such as argon gas in place of the nitrogen atmosphere 16. Further, a similar effect can also be attained by replacing the nitrogen atmosphere 16 with an atmosphere of a gas not reacting with the polymer under the light 15, in general.

<1-2. Verification Test>

Figures 7, 8:
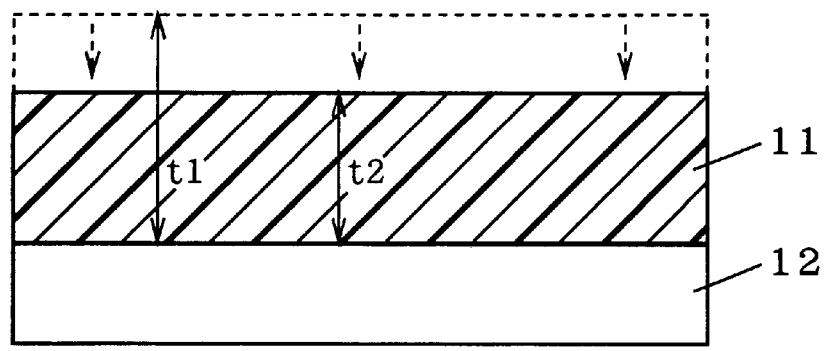
FIG. 7 is a step diagram showing a method of a verification test.
FIG. 8 illustrates results of verification tests.

Description is now made on a verification test employing resist materials containing the resin 1 shown in FIG. 2 as the base resin and results thereof. The verification test was made by applying each resist material 11 onto a semiconductor substrate 12 similarly to the step shown in FIG. 3, and thereafter executing the step shown in FIG. 1 without executing the patterning step shown in FIGS. 4 and 5. In other words, the overall surface of the resist material 11 applied onto the semiconductor substrate 12 was irradiated with light 15 in a nitrogen atmosphere 16. FIG. 7 is a step diagram showing this step. Thereafter the resist material 11 was etched.

No patterning step was executed, in order to eliminate influence such as the aforementioned RIE-lag phenomenon exerted by the pattern on the dry etching resistance for obtaining correct evaluation values with respect to the dry etching resistance. The resist material 11 was irradiated with the light 15 with strength of 200 mW/cm$^2$ over one minute, as described above. The nitrogen atmosphere 16 was formed by feeding nitrogen gas at a flow rate of 30 ml/min.

The dry etching resistance was evaluated by the etching rate. The dry etching resistance can be evaluated higher as the etching rate is reduced. Further, the resist film thickness ratio was also measured along with the dry etching resistance, as one of evaluation values for evaluating the resist pattern forming method.

The resist film thickness ratio is defined as the ratio of a thickness t2 after irradiation with the light 15 to a thickness t1 of the unirradiated resist material 11, as shown in FIG. 7. Shrinkage of the resist material 11 following irradiation with the light 15 is reduced as the resist film thickness ratio approaches 1. This means that as the ratio approaches 1, the resist pattern 14 is less deformed following irradiation with the light 15 after patterning.

Namely, it is desirable that the resist film thickness ratio approaches 1. The resist pattern forming method is evaluated by totalizing these evaluation values. Shrinkage of the resist material 11 following irradiation with the light 15 results from chemical amplification causing dissociation of the substituent D1.

FIG. 8 is an explanatory diagram showing the results of the verification test in the form of a table. Referring to FIG. 8, the row No. 1 shows results in relation to the resist material 11 containing the resin 1 as the base resin under the aforementioned conditions. The etching rate was 2300 Å/min., and the resist film thickness was 0.75.

The rows Nos. 10 to 13 show comparative results obtained on the basis of the prior art. The resins A and B were prepared from novolak resin and polyhydroxystyrene respectively. The results shown in the rows Nos. 10 to 13 related to the prior art were obtained only through etching with neither patterning nor irradiation with the light 15 shown in FIG. 7 as to the resins A, B, C and D.

In the verification test shown in FIG. 8, an ECR etcher was employed in the etching step along with fluorocarbon gas serving as an etchant.

In the conventional methods utilizing the resins A and B which are widely employed at present, the etching rates were 1500 Å/min. and 1700 Å/min. respectively. If an etching rate around these values is obtained, it means that the dry etching resistance is a match for those of the currently employed well-known techniques. In other words, each of the above values can be regarded as one target value related to the dry etching resistance.

In the conventional methods employing the resins C and D, the etching rates were 3500 Å/min. and 2500 Å/min. respectively. Namely, the dry etching resistance was remarkably deteriorated as compared with the methods employing the resins A and B. With reference to the conventional methods, the resist film thickness ratios cannot be evaluated due to no irradiation with the light 15. The resist materials irradiated with no light 15 cause no shrinkage. In theory, therefore, the resist film thickness ratios of these materials can be regarded as equal to 1.

In the method according to the embodiment 1 employing the resin 1, on the other hand, the etching rate was 2300 Å/min. Namely, an improving effect is recognized at least as compared with the conventional methods employing the resins C and D. However, the resist film thickness ratio was 0.75, and hence the dry etching resistance can be evaluated as being improved at the sacrifice of the pattern shape keepability to some extent.

The rows Nos. 14 and 15 in FIG. 8 show results obtained by applying the method according to the embodiment 1 to the resins C and D. As shown in these rows, both etching rates and resist film thickness ratios were unmeasurable in relation to the resist materials containing the resins C and D after application of the method according to the embodiment 1 including the step of irradiating the resins C and D with the light 15 shown in FIG. 7. Namely, the resins C and D were gasified and sublimed in the step shown in FIG. 7.

This resulted from the fact that the resins C and D have no units containing hydrogen located at the α-positions dissimilarly to the resin 1 and hence no crosslinking reaction is induced following irradiation with the light 15 but chemical amplification and a reaction of cutting principal chains of methacrylic units exclusively progress. Namely, the verification data backs up the fact that the active hydrogen contained in the resin 1 plays an important role on the crosslinking reaction improving the dry etching resistance.

<1-3. Examples Employing Resins 2 to 4>

The method according to the embodiment 1 was also applied to resins 2 to 4, in addition to the resin 1. A verification test related to the resins 2 to 4 is now described.

Figure 9:
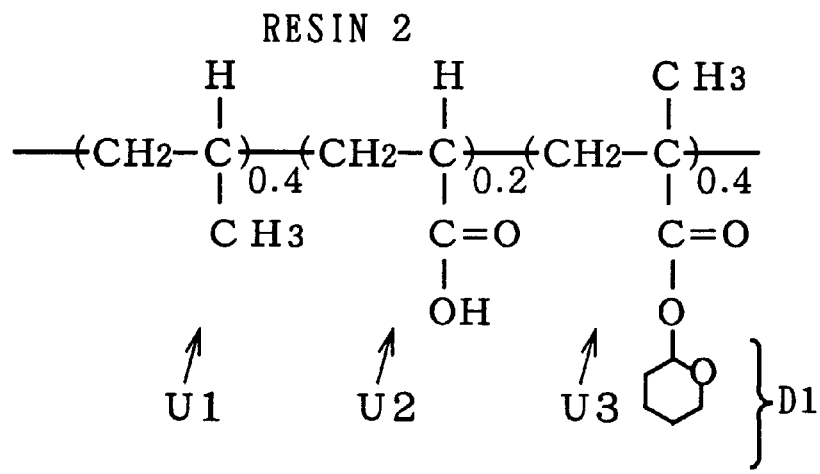
FIG. 9 illustrates the structural formula of a resin 2.

FIG. 9 illustrates the structural formula of the resin 2. The resin 2 is characteristically different from the resin 1 in a point that hydrogen is located at the α-position of a unit U2 in place of a methyl group similarly to a unit U1. Namely, not only the unit U1 but the unit U2 forming an acrylic unit is expressed as "—CH$_2$CHR—". Therefore, the resin 2 contains the units expressed as "—CH$_2$CHR—" in a composition ratio of 60%. A unit U3 has a substituent D1, similarly to the resin 1.

Figure 10:
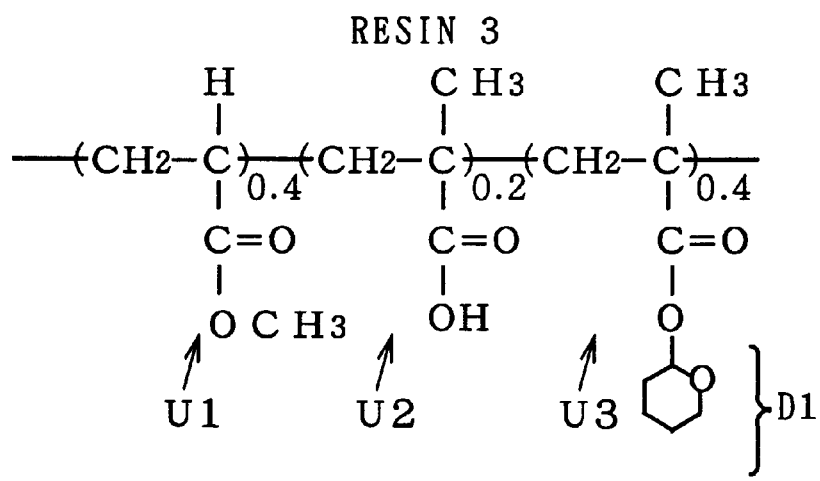
FIG. 10 illustrates the structural formula of a resin 3.

FIG. 10 illustrates the structural formula of the resin 3. In this resin 3, a unit 1 has carboxylic acid ester. Namely, the resin 3 is characteristically different from the resin 1 in a point that the unit 1 having hydrogen at the α-position also forms an acrylic unit. A unit U3 has a substituent D1, similarly to the resin 1.

Figure 11:
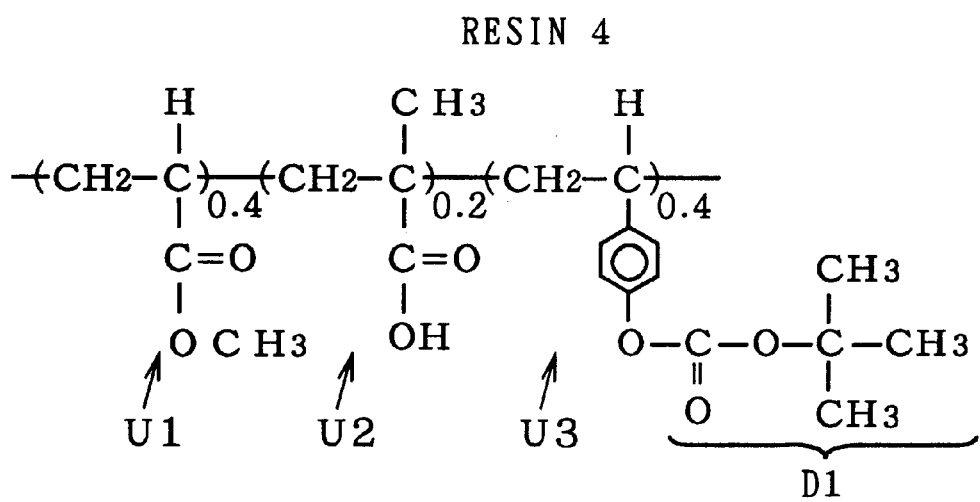
FIG. 11 illustrates the structural formula of a resin 4.

FIG. 11 illustrates the structural formula of the resin 4. The resin 4 is characteristically different from the resin 1 in a point that hydrogen is located at the α-position of a unit U3 in place of a methyl group, similarly to a unit U1. Namely, not only the unit U1 but the unit U3 forming an acrylic unit is expressed as "—CH$_2$CHR—". In this unit U3, "R" corresponds to a group having an aromatic ring.

Therefore, the resin 4 contains the units expressed as "—CH$_2$CHR—" in a high composition ratio of 80%. The unit U3 has a substituent D1 capable of being decomposed by acid, similarly to the resin 1. This substituent D1, which is different in chemical structure from the substituent D1 of the resin 1, can be also decomposed by acid.

Each of the resins 3 and 4 is an exemplary polymer having acrylic units expressed by a chemical formula "—CH$_2$CH (COOR$_1$)—". This polymer is included in those having units expressed in the chemical formula "—CH$_2$CHR—". "R$_1$" is a rest of "R" excluding a carboxylic group and carboxylic acid ester, i.e., hydrogen, an alkyl group, acetal, an alicyclic group, a group having an aromatic ring, or a group having a heterocycle, or the like.

The rows Nos. 2 to 4 show results obtained in relation to resist materials 11 containing the resins 2 to 4 as base resins similarly to the resist material 11 containing the resin 1 as the base resin. In the method employing the resin 2, the etching rate was 2000 Å/min., and the dry etching resistance was improved as compared with the resin 1. On the other hand, the resist film thickness ratio was 0.73, with no great difference as compared with the resin 1. Totally judged, the resin 2 having the units containing active hydrogen in a high composition ratio can be regarded as having superior characteristics to the resin 1.

In the method employing the resin 3, both the etching rate and the resist film thickness ratio were somewhat inferior as compared with the resin 1. In the method employing the resin 4 having the units containing active hydrogen in the high composition ratio of 80%, on the other hand, the etching rate was 1500 Å/min., i.e., equivalent to that in the conventional method employing the resin A, although the resist film thickness ratio was at a low value of 0.69. Namely, the resin 4 can be regarded as attaining one target value in relation to the dry etching resistance.

As understood from the results of the test in relation to the resins 1 to 4, the dry etching resistance is improved as the composition ratio of units having active hydrogen is increased.

2. Embodiment 2

An embodiment 2 of the present invention employs a polymer having a unit expressed in the chemical formula "—CH$_2$CHR—" and containing a substituent, capable of being decomposed by acid, having a thermal decomposition temperature of at least 140° C. capable of being as a base resin of a resist material 11. This unit having hydrogen at the α-position is preferably an acrylic unit expressed in the chemical formula "—CH$_2$CH(COOR$_1$)—". The substituent having a thermal decomposition temperature of at least 140° C. can be prepared from tert(tertiary)-butoxy group, an ethoxyethyl group or the like.

Figure 12:
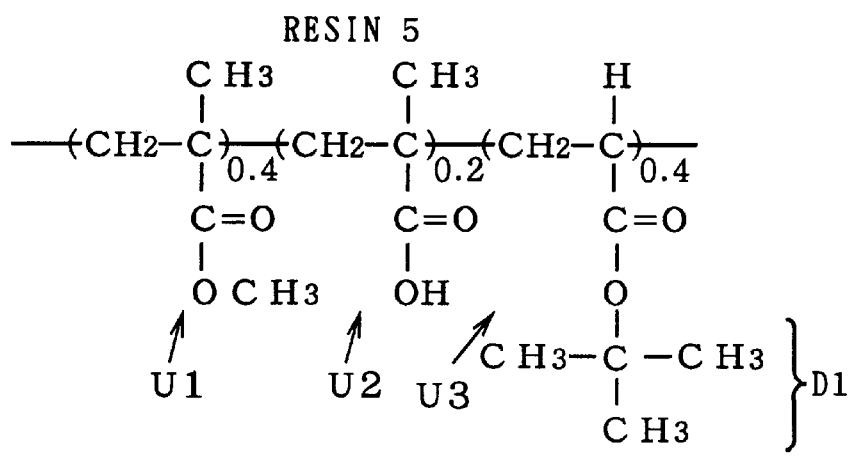
FIG. 12 illustrates the structural formula of a resin 5.

FIG. 12 shows the structural formula of an exemplary base resin 5 employed in this embodiment. The resin 5 is a polymer having units U1, U2 and U3, which are in the composition ratios of 0.4:0.2:0.4. The unit U3 corresponds to the aforementioned acrylic unit expressed as "—CH$_2$CH (COOR$_1$)—". Namely, a hydrogen atom is present at the α-position of the unit U3. The unit U3 also has a substituent D1 which is capable of being decomposed by acid. "R$_1$" also serves as the substituent D1. The thermal decomposition temperature of this substituent D1 exceeds 140° C. The unit U1 has carboxylic acid ester, and the unit U2 has a carboxyl group. Namely, the units U1 and U2 form methacrylic units.

Figure 13:
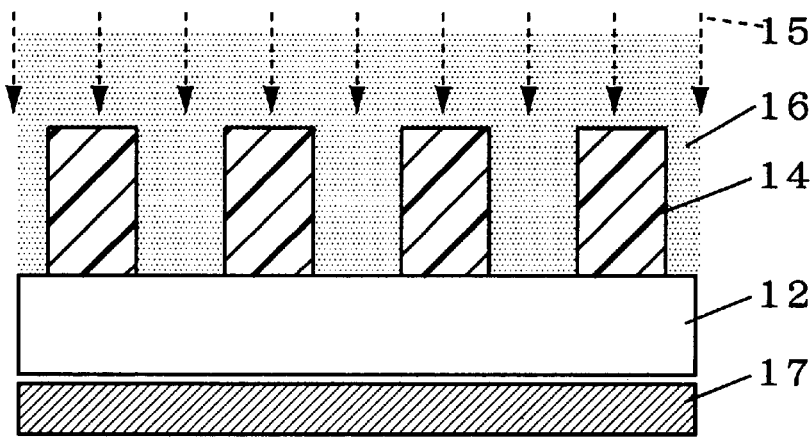
FIG. 13 is a step diagram showing a method according to an embodiment 2 of the present invention.

FIG. 13 is a step diagram showing a resist pattern forming method according to this embodiment. In this method, the resist material 11 containing a base resin such as the resin 5 is first prepared, and thereafter steps similar to those shown in FIGS. 3 to 5 are carried out. Then, the overall surface of a resist pattern 14 is irradiated with light 15 having a wavelength of not more than 300 nm under a nitrogen atmosphere 16, as shown in FIG. 13. During, after or during and after the irradiation with the light 15, the resist pattern 14 is heated with a hot plate 17, for example, within a temperature range below the thermal decomposition temperature of the resin 5. Thereafter the resist pattern 14 is subjected to selective etching of a surface part of a semiconductor substrate 12.

Not only in the resin 5 but each of various types of polymers employed in the respective embodiments, the substituent capable of being decomposed by acid is decomposed by action of acid such as hydrogen generated by the acid generator under irradiation with the light 13 or 15, as described above. Consequently, gas such as carbon dioxide, isobutene or diethyl ether is generated and discharged toward the exterior of the resist material containing the polymer as the base resin. Shrinkage of the resist material following chemical amplification results from this mechanism.

Shrinkage following irradiation with the light 13 in the patterning step hardly exerts a bad influence on the resolution of the patterning. This is because the parts irradiated with the light 13, i.e., shrinking parts, are removed by the subsequent developing step.

However, shrinkage following irradiation with the light 15 after patterning, which brings deformation of the resist pattern 14 and reduction of its thickness, is preferably eliminated or suppressed, as described above. In the method according to this embodiment, the resist pattern 14 is heated in addition to the irradiation with the light 15, whereby a crosslinking reaction is facilitated. Further, the resist pattern 14 is heated within the temperature range below the thermal decomposition temperature of the substituent capable of being decomposed by acid, whereby the crosslinking reaction is further accelerated as compared with chemical amplification.

Namely, facilitation of the chemical amplification causing shrinkage is relatively suppressed, and the crosslinking reaction improving dry etching resistance is selectively facilitated. Therefore, it is expected that a resist pattern 14 having high dry etching resistance is obtained with small shrinkage. Particularly when the substituent capable of being decomposed by acid is prepared from an ethoxyethyl group, this substituent serves as a crosslinking agent, thereby further facilitating the crosslinking reaction.

FIG. 8 shows results of a verification test on the method according to this embodiment in relation to the resist material 11 containing the base resin 5 in the row No. 5. Also in this verification test, the unpatterned resist material 11 was irradiated with the light 15 and heated in the nitrogen atmosphere 16, as shown in FIG. 7.

The conditions of the light 15 and the nitrogen atmosphere 16 ere identical to those for the verification test in the embodiment 1. Namely, the resist material 11 was irradiated with the light 15 with strength of 200 mW/cm$^2$ over one minute. The nitrogen atmosphere 16 was formed by feeding nitrogen gas at a flow rate of 30 ml/min. The resist material 11 was heated simultaneously with the irradiation with the light 15. The temperature of the resist material 11 was increased from 90° C. to 120° C. at a speed of 0.5° C./sec.

As understood from the row No. 5 in FIG. 8, the resist film thickness ratio was 0.93, i.e., an ideal value close to "1" in the test employing the resin 5 related to the method according to this embodiment. The etching rate was 1800 Å/min., which was close to the result based on the conventional method employing the resin A. In other words, results satisfying the expectation for inhibiting the resist material 11 from shrinkage and improving its dry etching resistance were obtained.

Figure 14:
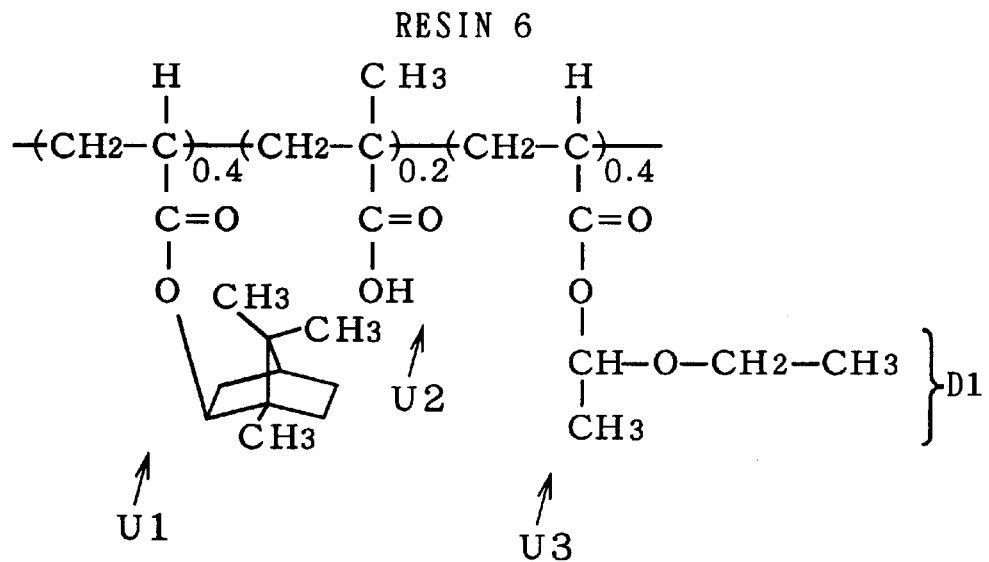
FIG. 14 illustrates the structural formula of a resin 6.

The verification test for the method according to the embodiment 2 was also made on a resin 6, in addition to the resin 5. FIG. 14 illustrates the structural formula of the resin 6. In this resin 6, both units U1 and U3 are expressed as "$CH_2CH(COOR_1)$—". "$R_1$" is an alicyclic group in the unit U1, and acetal in the unit U3. "$R_1$" also serves as a substituent D1 capable of being decomposed by acid, similarly to the resin 5. The thermal decomposition temperatures of the substituent D1 exceeds 140° C., similarly to the resin 5. The feature of the resin 6 resides in that the units having active hydrogen are contained by 80%, in a composition ratio higher than that in the resin 5.

FIG. 8 shows results obtained in relation to the resin 6 in the row No. 6. The resin 6 was tested similarly to the resin 5. In the method employing the resin 6, the etching rate was 1200 Å/min., which was lower than the value obtained in the conventional method employing the resin A. In other words, a result exceeding the target value was obtained in relation to the dry etching resistance.

Further, the resist film thickness ratio was 0.96, which was further closer to "1" than that in the test employing the resin 5. In other words, the most excellent characteristics were obtained on the dry etching resistance as well as total evaluation including the resist film thickness ratio by employing the method according to the embodiment 2 and utilizing the polymer containing the units having active hydrogen in a high composition ratio.

3. Embodiment 3

An embodiment 3 of the present invention employs a polymer having a unit expressed as the chemical formula "—$CH_2CHR$—" and containing a substituent capable of being decomposed by acid as a base resin of a resist material, similarly to the embodiment 1.

Figure 15:
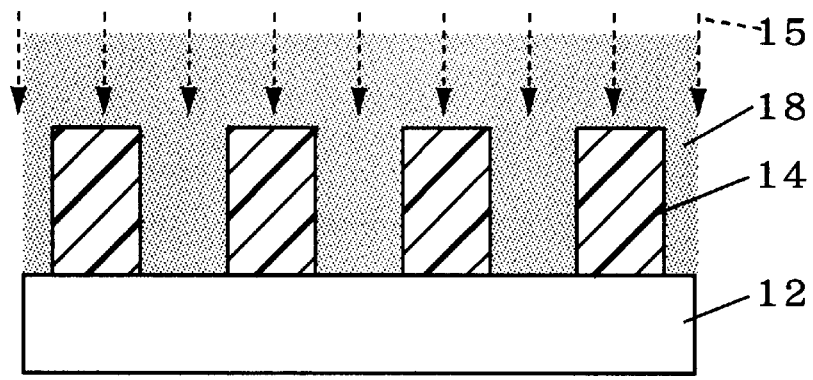
FIG. 15 is a step diagram showing a method according to an embodiment 3 of the present invention.

FIG. 15 is a step diagram showing a resist pattern forming method according to this embodiment. In this method, a resist material 11 having a base resin prepared from any of the resins 1 to 6, for example, is first prepared, and thereafter steps similar to those shown in FIGS. 3 to 5 are carried out. Then, the overall surface of a resist pattern 14 is irradiated with light 15 having a wavelength of not more than 300 nm under an atmosphere 18 of the same type of gas as that generated following acid induced decomposition of the substituent contained in the base resin, as shown in FIG. 15. Thereafter, the resist pattern 14 is subjected to selective etching of a surface part of a semiconductor substrate 12.

The gas generated following the acid induced decomposition of the substituent contained in the base resin depends on the type of the polymer employed as the base resin. For example, carbon dioxide, isobutene, ether, ethane, propane or the like is generated. When the base resin is prepared from the resin 4, carbon dioxide is generated following the acid induced decomposition of the substituent D1 contained in the resin 4, and hence the gas atmosphere 18 may be prepared from an atmosphere of carbon dioxide.

The gas atmosphere 18 supplies the vapor pressure of the gas generated following the decomposition of the substituent D1 induced by acid to the resist pattern 14. Therefore, gas discharge from the resist pattern 14 to the exterior is suppressed. Consequently, the resist pattern 14 is inhibited from shrinkage. This effect is remarkable as the pressure of the gas atmosphere 18 is increased. Therefore, the gas atmosphere 18 is preferably pressurized to a pressure level higher than the ordinary pressure.

FIG. 8 shows results of a verification test on the method according to this embodiment in relation to the resist material 11 containing the base resin 4 in the row No. 7. Also in this verification test, the unpatterned resist material 11 was irradiated with the light 15, as shown in FIG. 7. The resist material 11 was irradiated with the light 15 with strength of 200 mW/cm$^2$ over one minute, similarly to the verification test in the embodiment 1. The gas atmosphere 18 was formed by pressurizing carbon dioxide to a pressure level exceeding the ordinary pressure.

As understood from the row No. 7 in FIG. 8, the resist film thickness ratio was 0.95, i.e., an ideal value close to "1" in the test employing the resin 4 related to the method according to this embodiment. The etching rate was 1500 Å/min., which was identical to the result based on the conventional method employing the resin A. In other words, results satisfying the expectation for inhibiting the resist material 11 from shrinkage and improving its dry etching resistance were obtained.

4. Embodiment 4

An embodiment 4 of the present invention also employs a polymer having a unit expressed in the chemical formula "—$CH_2CHR$—" and containing a substituent capable of being decomposed by acid as a base resin of a resist material, similarly to the embodiment 1.

In a resist pattern forming method according to this embodiment, a resist material 11 having a base resin such as any of the resins 1 to 6, for example, is first prepared and thereafter steps similar to those shown in FIGS. 3 to 5 are carried out. Then, a resist pattern 14 is irradiated with light 15 under a nitrogen atmosphere 16, as shown in FIG. 13. During the irradiation with the light 15, the resist pattern 14 is heated with a hot plate 17, for example.

In this case, the heating temperature is not restricted in relation to the thermal decomposition temperature of the polymer employed as the base resin for the resist material 11, dissimilarly to the embodiment 2. In other words, the resist pattern 14 can be heated up to a temperature exceeding the thermal decomposition temperature of the employed polymer. This further facilitates crosslinking reaction. However, the effect of inhibiting the resist material 11 from shrinkage by relatively suppressing chemical amplification is somewhat weakened, due to no restriction on the heating temperature range in relation to the thermal decomposition temperature of the substituent capable of being decomposed by acid.

FIG. 8 shows results of a verification test on the method according to this embodiment in relation to the resist material 11 containing the base resin 1 in the row No. 8. Also in this verification test, the unpatterned resist material 11 was irradiated with the light 15 in the nitrogen atmosphere 16, as shown in FIG. 7. The resist material 11 was irradiated with the light 15 with strength of 200 mW/cm$^2$ over 100 seconds. The nitrogen atmosphere 16 was formed by feeding nitrogen gas at a flow rate of 30 ml/min., similarly to the verification test in the embodiment 1. The temperature of the resist material 11 increased from 50° C. to 150° C. at a speed of 1° C./sec. with the hot plate 17. As understood from the row No. 8 in FIG. 8, the etching rate was 1800 Å/min. and the resist film thickness ratio was 0.67 in the test employing the resin 1 in relation to the method according to this embodiment. Namely, a value close to the result based on the conventional method employing the resin A was obtained in relation to the etching rate, although the resist film thickness ratio was deteriorated as compared with the result in the row No. 1 obtained with no heating step. Thus, dry etching resistance was further improved by the heating, to back up the prediction related to the aforementioned effect of heating.

While the resist material 11 was irradiated with the light 15 under the nitrogen atmosphere 16 in the verification test, the nitrogen atmosphere 16 may be replaced with the gas atmosphere 18, similarly to the embodiment 3.

5. Embodiment 5

According to the embodiment 4, the resist material 11 is heated during irradiation with the light 15. According to an embodiment 5 of the present invention, on the other hand, a resist material 11 is heated after irradiation with light 15, dissimilarly to the embodiment 4. The type of an employed base resin is similar to that in the embodiment 4.

Figure 16:
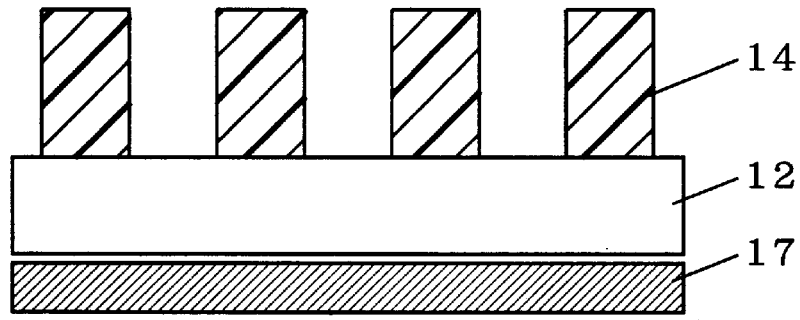
FIG. 16 is a step diagram showing a method according to an embodiment 5 of the present invention.
Figure 17:
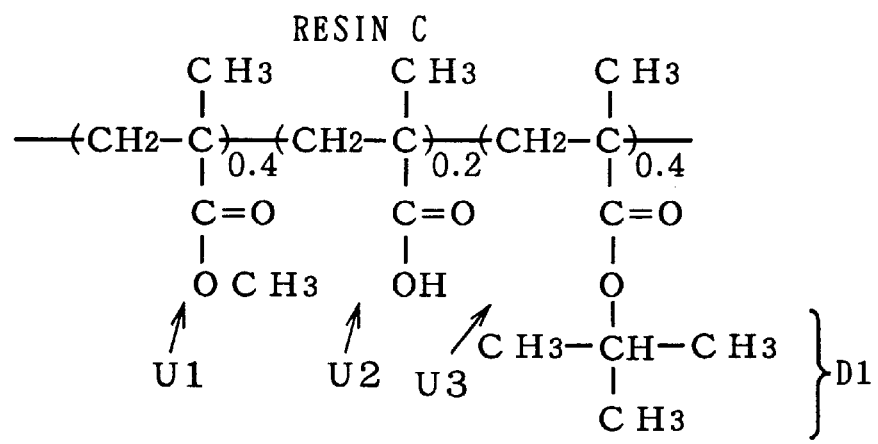
FIG. 17 illustrates the structural formula of a resin C.
Figure 18:
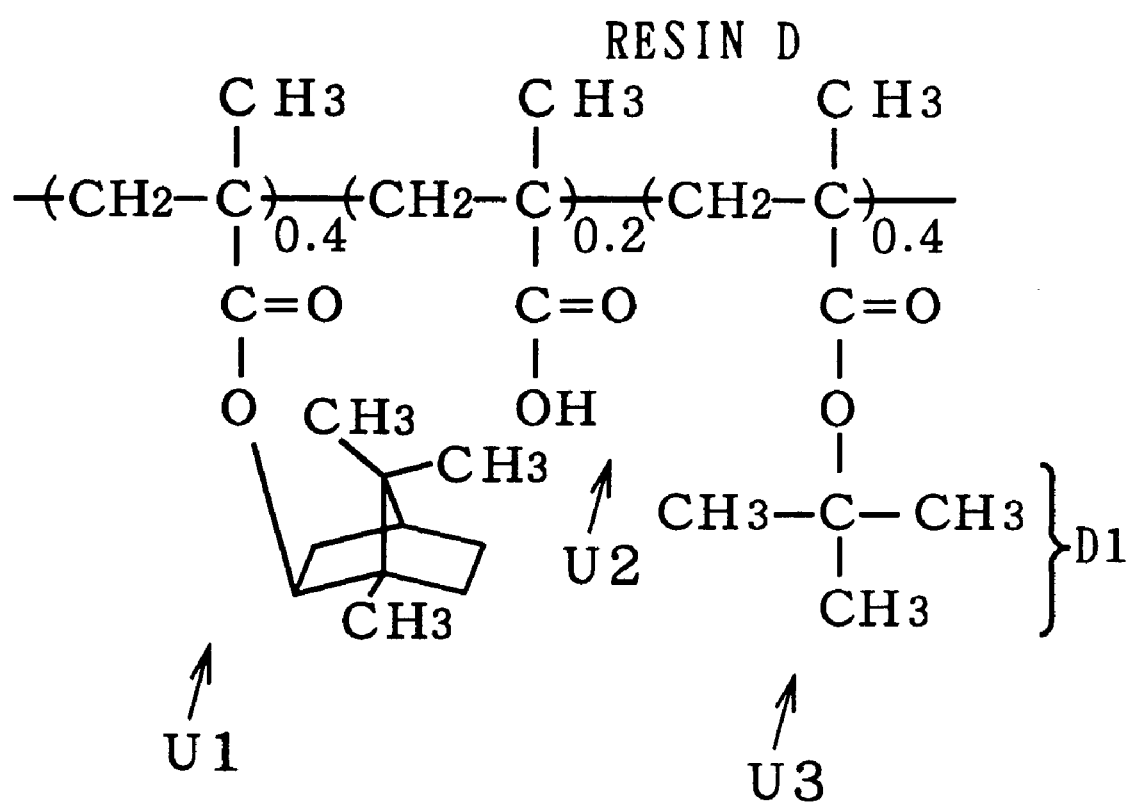
FIG. 18 illustrates the structural formula of a resin D.

FIG. 16 is a step diagram showing a resist pattern forming method according to this embodiment. In this embodiment, the resist material 11 containing any of the resins 1 to 6, for example, as base resin is first prepared, and thereafter steps similar to those in FIGS. 3 to 5 are executed. Then, a resist pattern 14 is irradiated with the light 15 under a nitrogen atmosphere 16, as shown in FIG. 1.

After completion of the irradiation with the light 15, the resist pattern 14 is heated with a hot plate 17, for example, as shown in FIG. 16. The light 15 is already stopped, and hence the resist pattern 14 may not necessarily be heated under the nitrogen atmosphere 16.

Also in the method according to this embodiment, the resist pattern 14 may be heated up to a temperature exceeding the thermal decomposition temperature of the employed polymer. This further facilitates crosslinking reaction. The resist pattern 14 is heated after completion of the irradiation with the light 15, and hence it is predicted that the speed of the crosslinking reaction is somewhat weakened as compared with the embodiment 4. However, the resist pattern 14 is irradiated with the light 15 with no heating, and hence only the crosslinking reaction exclusively progresses in the process of applying the light 15, to suppress decomposition of the substituent.

Thereafter the resist pattern 14 is heated, to further facilitate progress of the crosslinking reaction. A crosslinked structure is already considerably completed at this time, and hence decomposition of the substituent is similarly suppressed even under the heating. Even if decomposition takes place to some extent to generate gas, the resist material 11 is inhibited from shrinkage since the crosslinked structure is considerably completed.

FIG. 8 shows results of a verification test in relation to the resist material 11 containing the base resin 1 in the row No. 9. Also in this verification test, the unpatterned resist material 11 was irradiated with the light 15 in the nitrogen atmosphere 16 and thereafter heated, as shown in FIG. 7.

The resist material 11 was irradiated with the light 15 with strength of 200 mW/cm² over 1 minute. The nitrogen atmosphere 16 was formed by feeding nitrogen gas at a flow rate of 30 ml/min., similarly to the verification test in the embodiment 1. The temperature of the resist material 11 was increased from 50° C. to 150° C. at a speed of 1° C./sec. with the hot plate 17, similarly to the verification test in the embodiment 4.

As understood from the row No. 9 in FIG. 8, the etching rate was 2000 Å/min. and the resist film thickness ratio was 0.73 in the test employing the resin 1 in relation to the method according to this embodiment. Namely, the etching rate was improved, although the resist film thickness ratio was somewhat deteriorated as compared with the result in the row No. 1 obtained with no heating.

As compared with the results of the embodiment 4 shown in the row No. 8, on the other hand, the resist film thickness ratio was improved although the etching rate was somewhat deteriorated. Namely, this backs up the aforementioned prediction that the resist material is inhibited from shrinkage due to the heating after the irradiation with the light 15.

While the resist material 11 was irradiated with the light 15 under the nitrogen atmosphere 16 in the verification test, the nitrogen atmosphere 16 may be replaced with the gas atmosphere 18, similarly to the embodiment 3.

6. Modification

Although the light 13 is employed for exposure in the patterning step shown in FIG. 4 in each of the aforementioned embodiments, the present invention is not restricted to light but general radiation including electron beams, X-rays and the like is employable so far as the same brings chemical amplification.

While the invention has been shown and described in detail, the foregoing description is in all aspects illustrative and not restrictive. It is therefore understood that numerous modifications and variations can be devised without departing from the scope of the invention.

I claim:

1. A method for forming a resist pattern on a surface of a target which comprises:

applying a resist onto the surface of said target;

patterning said resist through selective irradiation with radiation; and irradiating said patterned resist with light having a wavelength of not more than 300 nm in an atmosphere of non-reactive gas, said resist containing a polymer of the repeating unit —$CH_2CHR$— and units of a monomer containing a substituent capable of being decomposed by acid, wherein the repeating unit —$CH_2CHR$— is present in an amount of at least 50% by number of said polymer, wherein R is selected from the group consisting of hydrogen, an alkyl group, a carboxyl group, carboxylic acid ester, acetal, an alicyclic group, a group having an aromatic ring, and a group having a heterocycle or mixtures thereof, said resist further containing an acid generator which generates acid during said irradiation, said non-reactive gas being non-reactive with said polymer under said light.

2. The resist pattern forming method in accordance with claim 1, wherein said non-reactive gas is either inert gas or nitrogen gas.

3. The resist pattern forming method in accordance with claim 1, further comprising:

heating said patterned resist during, after, or during and after said patterned resist is irradiated.

4. The resist pattern forming method in accordance with claim 3, wherein said resist is heated within a temperature range of 50° C. to 200° C.

5. The resist pattern forming method in accordance with claim 3, wherein said heating of the patterned resist is executed after said irradiation of the patterned resist.

6. The resist pattern forming method in accordance with claim 3, wherein said resist is heated within a temperature range below a heat decomposition temperature of said units of a monomer containing a substituent capable of being decomposed by acid.

7. The resist pattern forming method in accordance with claim 6, wherein said repeating unit of the formula —CH$_2$CHR— is an acrylic unit of the formula —CH$_2$CH(COOR$_1$)—, wherein R$_1$ is selected from the group consisting of hydrogen, an alkyl group, acetal, an alicyclic group, a group having an aromatic ring, a group having a heterocycle and mixtures thereof.

8. The resist pattern forming method in accordance with claim 7, wherein said heat decomposition temperature is at least 140° C., and said resist is heated within a temperature range of 50° C. to 140° C.

9. The resist pattern forming method in accordance with claim 7, wherein said substituent capable of being decomposed by acid is selected from the group consisting of a tertiary-butoxy group, an ethoxyethyl group, and mixtures thereof.

10. The resist pattern forming method in accordance with claim 1, wherein said repeating unit —CH$_2$CHR— is present in an amount of at least 70% by number of said polymer.

11. The resist pattern forming method in accordance with claim 10, wherein said repeating unit of the formula —CH$_2$CHR— is an acrylic unit of the formula —CH$_2$CH(COOR$_1$)—, and wherein R$_1$ is selected from the group consisting of hydrogen, an alkyl group, acetal, an alicyclic group, a group having an aromatic ring, a group having a heterocycle and mixtures thereof.

12. A method for forming a resist pattern on a surface of a target which comprises:

applying a resist onto the surface of said target;

patterning said resist through selective irradiation with radiation; and irradiating said patterned resist with light having a wavelength of not more than 300 nm in an atmosphere of a gas, said resist containing a polymer of the repeating unit —CH$_2$CHR— and units of a monomer containing a substituent capable of being decomposed by acid, wherein the repeating unit —CH$_2$CHR— is present in an amount of at least 50% by number of said polymer, wherein R is selected from the group consisting of hydrogen, an alkyl group, a carboxyl group, carboxylic acid ester, acetal, an alicyclic group, a group having an aromatic ring, a group having a heterocycle or mixtures thereof, said resist further containing an acid generator which generates acid during said irradiation, and wherein said gas used in irradiating said patterned resist is of the same type as that generated by the acid decomposition of said units of a monomer containing a substituent capable of being decomposed by acid.

13. The resist pattern forming method in accordance with claim 12, wherein said gas which is generated when said substituent capable of being decomposed by acid is decomposed by acid, is selected from the group consisting of carbon dioxide, isobutene, ether, ethane, propane and mixtures thereof.

14. The resist pattern forming method in accordance with claim 12, wherein said atmosphere is pressurized up to a pressure exceeding the ordinary pressure.

15. The resist pattern forming method in accordance with claim 12, further comprising:

heating said patterned resist during, after, or during and after said patterned resist is irradiated.

16. The resist pattern forming method in accordance with claim 15, wherein said heating of the patterned resist is executed after said irradiation of the patterned resist.

17. The resist pattern forming method in accordance with claim 12, wherein said repeating unit —CH$_2$CHR— is present in an amount of at least 50% by number of said polymer.

18. The resist pattern forming method in accordance with claim 17, wherein said repeating unit —CH$_2$CHR— is present in an amount of at least 70% by number of said polymer.

19. A resist comprising a polymer and an acid generator, wherein said polymer has a repeating unit —CH$_2$CHR— and units of a monomer containing a substituent capable of being decomposed by acid, said repeating unit —CH$_2$CHR— being present in an amount of at least 50% by number of said polymer, wherein R is selected from the group consisting of hydrogen, an alkyl group, a carboxyl group, carboxylic acid ester, acetal, an alicyclic group, a group having an aromatic ring, a group having a heterocycle and mixtures thereof, and wherein said acid generator is a substance which generates acid during irradiation with radiation.

20. The resist in accordance with claim 19, wherein said repeating unit —CH$_2$CHR— is present in an amount of at least 70% by number of said polymer.

* * * * *